Jan. 9, 1962 G. C. COLLINS 3,016,505

TURRET TUNER

Original Filed June 30, 1958

INVENTOR
George C. Collins
BY Francis W. Crotty
ATTORNEY 3,016,505

TURRET TUNER

George C. Collins, Park Ridge, Ill., assignor to Zenith Radio Corporation, a corporation of Delaware Continuation of application Ser. No. 745,684, June 30, 1958. This application May 10, 1960, Ser. No. 28,105
10 Claims. (Cl. 334—51)

This is a continuation of an application of George C. Collins, Serial No. 745,684, filed June 30, 1958, now abandoned, and assigned to the same assignee as the present application.

This invention relates in general to tuning mechanisms for television receivers and is concerned particularly with the supporting and adjusting of tuning strips in a turret tuner.

Turret tuners have been widely and favorably accepted in the art because of their superior performance and flexibility. They feature the use of demountable strips each of which is designed to the end that it is selective to a particular television channel so that a combination of such strips mounted on the turret permits a user selectively to tune a television receiver to any of a variety of channels which may be available in his viewing area. One particularly meritorious feature of this sort of tuning mechanism is referred to in the art as "bull's-eye" tuning. The bull's-eye feature refers to the fact that proper adjustment of the tuning strips to their individual selected frequencies enables the receiver to be tuned from channel to channel upon the manipulation of a station selector knob without any need for fine tuning adjustment to optimize reception when any particular channel is selected. This is obviously a highly desirable attribute of this type device.

In order to achieve the bull's-eye effect, it has been the practice in the past to provide two types of adjustments. One is in the nature of a vernier tuning condenser provided in the heterodyning oscillator and the other is generally a tuning slug associated with that coil of the tuning strip which is brought into the frequency-determining circuit of the oscillator when the strip in question is in operating position within the receiver. The vernier condenser of the oscillator influences tuning conditions for all positions of the channel selector and is set for an optimized value whereas the oscillator tuning slug carried by the channel strip is manipulated to achieve bull's-eye tuning results on the basis of an individual channel. While this has operated very satisfactorily in the fast, it is indeed desirable to simplify the adjustments and to make the strip adjustment available at the front panel of the receiver; in the past it has always been relegated to the back or has otherwise been made a hidden control. If this desired end is accomplished, and the mechanism is arranged to rely solely on the adjustment of the oscillator coil on the tuning strip, the tuner becomes much simpler in construction and, at the same time, becomes less costly. Moreover, the elimination of the vernier condenser adjustment in the oscillator, as distinguished from the adjustment of the oscillator coil on the tuning strip, enhances the stability and causes the oscillator excitation to be essentially independent of fine tuning adjustments. These most attractive features have not been realized to the full in turret constructions known heretofore.

Another problem presented by prior structures concerns the arrangement for restricting the displacement of the tuning slug provided for the oscillator coil mounted on the tuning strip. It is certainly well-known to provide suitable stop abutments which restrict advancing the tuning slug within the coil either by arresting movement of the slug or the adjusting tool. Most such arrangements of the prior art, however, are subject to the difficulty that continued manipulation of the tuning tool, once the limit of travel of the slug has been obtained, tends to chew out or destroy the end section of the slug which the tool engages. This is obviously most undesirable.

It is therefore a principal object of the present invention to provide a tuning mechanism of the turret type which eliminates one or more of the aforementioned limitations of the structures used in the past.

It is another object of the invention to provide an improved turret-type tuning mechanism for a television receiver which achieves the aforementioned desirable features incident to an elimination of vernier capacitor adjustments within the circuitry of the heterodyning oscillator.

It is yet another object of the invention to provide a greatly simplified fine tuning adjustment for a turret tuner for a television receiver.

A more specific object of the invention is to provide an improved arrangement for supporting and indexing demountable tuning strips within a turret tuner and, at the same time, permitting simplified fine tuning from the front panel of the television receiver.

In accordance with the invention, a turret-type tuning mechanism comprises a tuning strip which includes a hollow core member and a plurality of conductive elements disposed in spaced relation along the core. The conductive elements contribute reactive impedances to determine the frequency characteristic of the strip. Means are provided for demountably supporting the tuning strip and include a pair of spaced coaxially aligned support panels. A bushing is provided on one of the panels for receiving and mechanically supporting one end of the core member. A tuning element which projects through the bushing extends within the core member and is axially displaceable of the bushing and the core member so as to constitute with the adjacent end one of the strip supported conductive elements, an adjustable reactance which presents an apparent reactance determined by the axial position of the tuning element. The free end of the tuning element is formed to facilitate engagement by a tool which effects selective axial displacement of the tuning element. Finally, a shield container is provided which encloses the turret mechanism and includes provisions to admit a tool into engagement with the free end of the tuning element.

The features of the present invention which are believed to be novel are set forth with particularity in the appended claims. The organization and manner of operation of the invention, together with further objects and advantages thereof, may best be understood by reference to the following description taken in connection with the accompanying drawing, in the several figures of which like reference numerals identify like elements, and in which:

Figure 1:
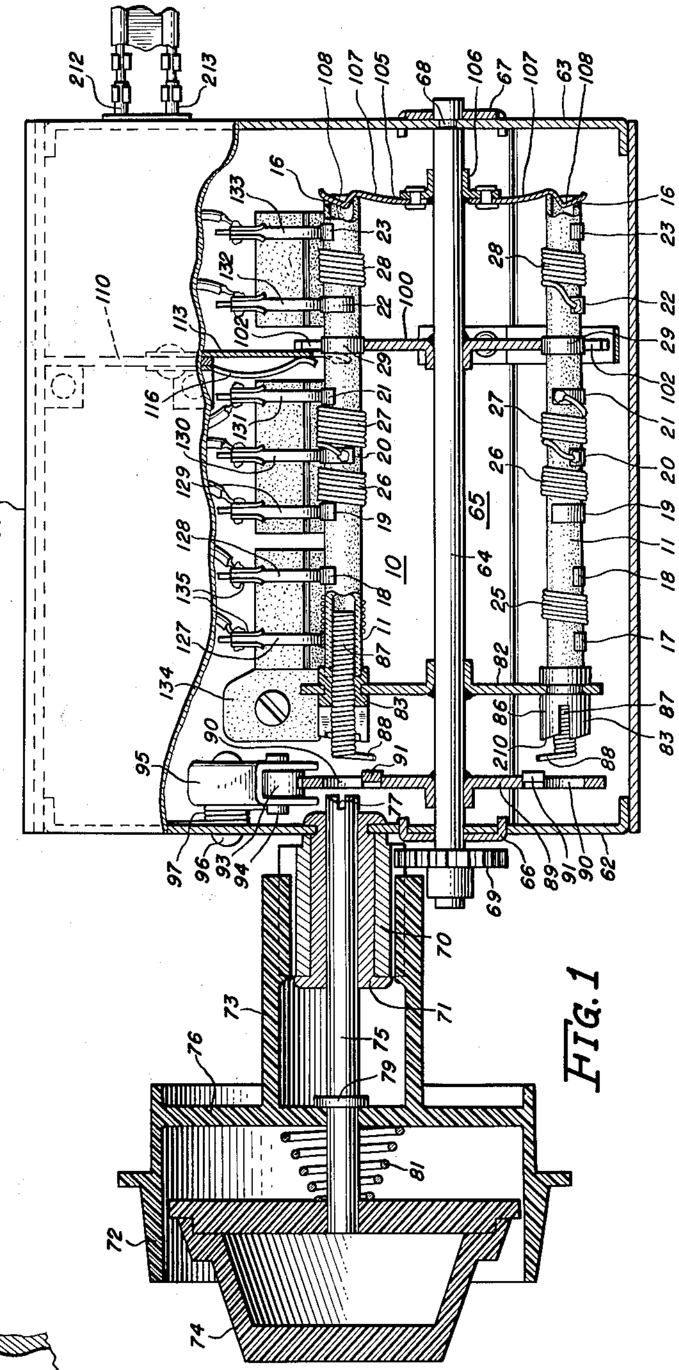
FIGURE 1 is a plan view, partly in section, of a turret-type tuning mechanism embodying the subject invention.

Referring now more particularly to FIGURE 1, the television tuning mechanism there represented is a turret-like device constructed in accordance with the invention for use with either VHF or UHF tuning strips, or a combination thereof. It is especially suited for tuning strips of the type described and claimed in copending application Serial No. 745,414, filed June 30, 1958, in the name of John F. Bell and assigned to the same assignee as the present invention.

Figure 3:
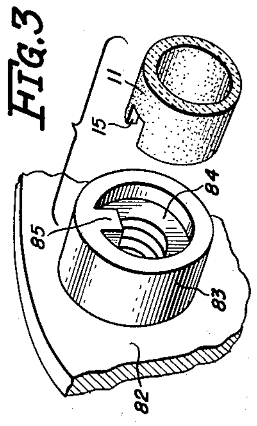
FIGURE 3 illustrates the indexing arrangement of a tuning strip support bushing employed in the turret of FIGURE 1.

The turret comprises a plurality of demountable tuning strips, such as the strip 10 shown in FIGURE 1. Each su h strip comprises a tubular or hollow core member 11 of insulating material such as steatite. A core having relieved extremities only may, of course, be utilized but it is more convenient to employ a tubular member 11. The opposed extremities of core 11 include an indexing notch 15, shown clearly in FIGURE 3, and a clearance notch 16, respectively, for indexing and mounting strip 10 in the tuner.

Tuning strip 10 includes a plurality of conductive elements which are disposed in spaced relation along core 11 for contributing reactive impedances to determine the frequency characteristic of the tuning strip, that is, to particularize the television channel to which the individual strip is to tune the receiver. More particularly, strip 10 comprises a plurality of spaced multi-turn coils 25–28 which are provided with terminal connectors 17–23.

The terminals 17–23 comprise arcuate segments of a conductive coating, such as silver, affixed to core 11 by firing or other suitable bonding process. The segments for any one coil are positioned upon core 11 in an overlapping but peripherally offset spaced relation and are oriented with respect to one another so that they present contact surfaces which are aligned along an axis which bisects indexing notch 15. Further, a grounding contact comprising a ring 29 of conductive material is disposed upon core 11 between coils 27, 28.

For purposes of clarity only two strips are shown in the drawing but it will be understood that the turret structure is generally arranged to accommodate at least twelve or thirteen and this number may be all VHF, all UHF or a mixture of VHF and UHF strips. Both types are shown and described in detail in the aforementioned Bell application.

These strips and the turret upon which they are supported are enclosed within a shield container comprising a housing 61 having spaced end walls 62, 63 which enclose a rotatable turret mechanism 65. End walls 62, 63 are slotted to receive the shaft 64 of turret 65. Shaft 64 is radially secured within the slotted end walls by a pair of bearing plates 66, 67 which are fastened to respective end walls 62, 63. One end of shaft 64 has an undercut 68 which, in cooperation with bearing plate 67, prevents axial displacement of the shaft. The other end of shaft 64 carries a pinion 69 which mates with a driving gear 70 rotatably captivated by a tubular stud 71 staked to end wall 62. The turret is further provided with a selector control knob 72 having a flange 73 which is keyed upon gear 70 and fastened thereto by conventional means. Of course, knob 72 is the customary control for manual operation of the turret to bring the tuning strips mounted thereon into sequential and individual operating relation with the remainder of the receiver.

The provisions for demountably securing tuning strips upon turret 65 include two spaced coaxially aligned support panels 82 and 100. The front support panel 82 has a plurality of internally threaded nylon bushings 83, one for each tuning strip position on the turret, secured adjacent its outer periphery. One end of each bushing has a cupped portion 84 for receiving and mechanically supporting one end of a tuning strip, see FIGURE 3. Bushing 83 includes means for cooperating with indexing notch 15 of core 11; more particularly, cupped portion 84 includes a key or tab 85 which mates with notch 15 to index the strip and to establish a predetermined presentation of terminal connectors 17–23.

Moreover, bushing 83 constitutes a stop device for restricting the movement of a tuning element provided to achieve "bull's-eye" tuning with the turret mechanism. The end of bushing 83 which faces housing wall 62 is formed to present a peripheral stop abutment to engage a tuning element, presently to be described, for the purpose of limiting displacement of that element in the direction of tuning strip 10. More particularly, this end of the bushing is slotted so as to comprise a plurality of sectors 86 and the terminal portion of each such sector constitutes a cam track 210 to be traversed by a portion of the tuning element.

The tuning element 87 takes the form of a flexible spiral spring with closely spaced turns to the end that the element appears as the screw part for engaging the internal thread provided in the central bore of the bushing. The tuning element projects through the bushing to extend within core 11 of the tuning strip supported by that bushing and constitutes with the adjacent circuit element of the strip an adjustable reactance presenting an apparent reactance determined by the axial position of the tuning element. For the strip structure illustrated, the adjacent component is coil 25 and the tuning element is displaceable of bushing 83 to enter the field of that coil and determine its effective inductance, which is similar to the function of a tuning slug and it is convenient to use that terminology herein.

The tuning slug has a cylindrical contour and its free end is formed to facilitate engagement by a tool to effect rotation of the slug and selective axial displacement of it relative to coil 25. Actually, the final section of the coiled conductor 87, from which the slug is formed, extends as a finger 88, projecting beyond the periphery of the slug.

Figure 4:
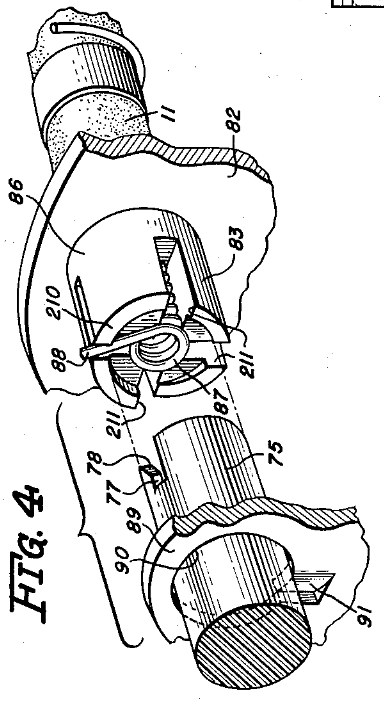
FIGURE 4 is an exploded view of the arrangement utilized in the tuner of FIGURE 1 for adjusting the tuning strips supported on the turret.

The structural features of bushing 83, permitting it to serve as a limiting device to restrict axial displacement of slug 87, are now more clearly understood. The end of the bushing adjacent housing wall 62 is formed to constitute a peripheral stop abutment for engaging the driving finger 88 of slug 87 to limit its displacement in the direction of core 11. More particularly, this end of the bushing has four slots defining a plurality of sectors 86, each of which is canted in the direction of the core to constitute a cam track to be traversed by driving finger 88. In other words, and with particular reference to FIGURE 4, the trailing edge of each cam track 210, assuming the cam follower to traverse that track in a clockwise direction, is closer to panel 82 than the leading edge of the next succeeding track section so that a cam follower coursing such section strikes against the leading portion 211 of the next succeeding cam track as an abutment. The internal diameter of this end of bushing 83 exceeds that of slug 87 and defines a channel way into which a tuning control or tool may be admitted assuming, of course, that the transverse dimensions of that tool are less than the interior diameter of the bushing. It is also preferred that the width of the slots cut in the bushing to form sectors 86 be at least slightly larger than the diameter of finger 88.

Figure 2:
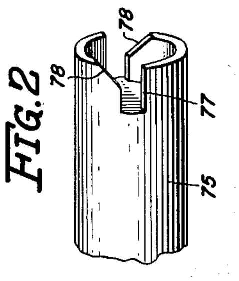
FIGURE 2 is a fragmentary perspective view of a tuning control for use in the turret tuner of FIGURE 1.

The tuning control 75, which is incorporated into the turret assembly, comprises a cylindrical shaft of nylon which extends through and is supported by a panel 76 of selector knob 72. It further extends through and is supported by stud 71. The end of the shaft which enters the shield housing 61 through stud 71 has a slotted driving head 77 serving as a wrench with chamfered portions 78 illustrated in FIGURE 2. The chamfered end need be provided only on the leading portion of the wrench jaw where the sense of leading is determined on the assumption that the tool is rotated in a clockwise direction. Tool 75 further has a shoulder 79 normally urged against panel 76 by a spring 81, trapped between panel 76 at one end and the closure plate of a fine tuning control knob 74 at the opposite end. The assembly of fine tuning control 74 concentrically within channel selector knob 72 is convenient and demonstrates the manner in which the arrangement under consideration facilitates location of the bull's eye or fine tuning control at the front panel of the receiver in nested relation with the channel selector.

A locking and detent plate 89 having an array of openings 90 located near its outer periphery is secured to shaft 64 between front support panel 82 and tuning control 75 with openings 90 in axial alignment with tuning slugs 87. An arresting ear 91, adjacent each opening 90, is upstruck from the detent plate 89. The periphery of plate 89 is scalloped to provide a series of indentations engageable with a roller 93 which is journalled upon an arbor 94 supported by a detent arm 95. Arm 95 is rotatably secured by a pin 96 fastened to end wall 62. A detent spring 97 is also positioned upon pin 96 and includes extensions which bear against housing 61 and arm 95 to urge roller 93 into engagement with a peripheral indentation of plate 89.

The turret mechanism of FIGURE 1, as indicated above, includes another support panel 100 peripherally serrated to provide a plurality of U-shaped slots 102 for lending additional support to the tuning strips and for preventing peripheral displacement thereof. Intermediate panel 100 is positioned upon shaft 64 so that the U-shaped slots 102 are axially aligned with bushings 83 and spaced therefrom to permit the grounding ring 29 of a tuning strip 10 to conductively contact its associated U-shaped slot.

A spider member 105 comprises a rear support panel for the tuning strip 10 and is likewise coaxially aligned with panel 82. Spider 105 is riveted to a sleeve 106 secured to shaft 64 and is comprised of a plurality of spring fingers 107 each having an offset portion 108 receivable within one extremity of hollow core member 11 for rotatably securing that end of strip 10. The spider member 105 is spaced from front support panel 82 a distance such that the offset portions 108 of fingers 107 are spaced from cupped portions 84 of bushings 83 by an amount which is less than the lenth of core 11 thus permitting the finger offset 108 to exert inward pressure upon the tuning strips to prevent radial or axial displacement thereof.

A shield and turret grounding structure, comprising an upright conductive member 110, is disposed parallel and adjacent the intermediate panel 100. The shield structure includes a conductive leaf 113 pinned to upright member 110. A biasing member 116 likewise pinned to member 110 urges leaf 113 into conductive engagement with panel 100.

The tuner further includes a stator assembly comprising the spaced stationary ribbon contacts 127–133 which are mounted upon a dielectric panel 134 and have their opposed ends secured to respective ones of the terminal lugs 135. The spacing of ribbon contacts 127–133 is identical to the spacing of conductive terminal segments 17–23, respectively, on core 11 so that the terminals of a strip indexed by selector knob 72 and the detent mechanism to its operating position in the tuner conductively engage corresponding stator ribbon contacts. Lugs 135 provide conductive connections between the ribbon contacts and associated tuner circuit components. Since the invention concerns only mechanical features of the tuning mechanism, the circuit connections completed by the engagement of these terminals have been omitted from FIGURE 1 for purposes of clarity. The tuner additionally includes a pair of antenna input terminals 212, 213 for coupling received signals from an antenna, not shown, to the tuner.

The tuner is mechanically set up for operation by mounting a series of pretuned strips upon turret 65. A strip 10 is positioned upon the turret by inserting flexible slug 87 within one end of the strip and inserting that end of the strip within cupped portion 84 of bushing 83 so that indexing tab 85 snugly engages notch 15 of the strip. The bushing 83 axially restrains the strip and prevents peripheral as well as radial displacement of the strip while tab 85 and notch 15 insure that the strip is properly indexed, presenting terminals 17–23 with the necessary orientation. The strip is then pivoted downwardly until offset portion 108 of the appropriate spider finger engages the bottom of hollow core 11 thereby radially anchoring that end and furnishing additional axial constraint of the strip. Simultaneously, an intermediate portion of strip 10 is received within the corresponding U-slot 102 of panel 100 to provide still additional peripheral restraint of the strip and to provide a positive conductive engagement between grounding ring 29 of the strip and support panel 100. It is to be noted that the use of the hollow tuning strip in conjunction with the flexible tuning slug 87 renders unnecessary any axial displacement of the strip in either mounting or demounting the strip. Furthermore, a single and simple structure, namely bushing 83, is utilized for concurrently supporting one end of the strip and for securing its tuning slug 87 in adjustably fixed relation to the end coil 25 of the strip.

In operating a tuner mechanism constructed in accordance with the invention, the turret is rotated by selector control knob 72 to bring the strips supported thereon sequentially to a reference position, i.e., until a strip individually selective to a desired predetermined signal frequency is coupled in operating relation with the remainder of the receiver. Specifically, this operation places the terminal contacts 17–23 of strip 10 in conductive engagement with ribbon contacts 127–133 of the stator assembly so that inductance coils 25–28 are electrically connected to the associated circuitry of the tuner. It is first assumed, of course, that coils 26–28 of strip 10 have been wound to exihibit a frequency characteristic such that when the coils are electrically connected to the associated tuner circuits, the completed circuits resonate at the frequency of the desired channel. Coil 25 which controls the operating frequency of the heterodyning oscillator which has been wound in like manner but to resonate in conjunction with its associated circuit at a frequency displaced from the resonant frequency of coils 26–28 by an amount equal to a desired intermediate frequency. Reference may be had to the above-identified Bell application for further details of the tuner and its associated circuitry. Since the subject invention is concerned most particularly with the support and tuning features of the demountable strips such further detail has not been presented herein.

If it is determined during operation that true bull's-eye tuning has not been achieved for any particular channel, adjustment of the tuning slug for that channel will perfect the tuning. In order to thus insure bull's-eye tuning for any given channel, it is necessary first to manipulate selector knob 72 to bring the turret strip assigned to that channel into operating relation with the remainder of the receiver. When that has been accomplished, fine tuning control 74 may be depressed to introduce the wrench-like termination of tool 75 to driving finger 88 of that particular slug, it, of course, being understood that there is a bushing-tuning slug assembly for every tuning strip accommodated by the turret. Such movement of the tuning control knob thrusts tool 75 through an aperture 90 of indexing plate 89 and locks the turret against further rotation until the tool resumes its initial position in which it clears the locking plate. Slight manipulaton of fine-tuning knob 74 causes the wrench to slip over finger 88 of the tuning slug. Rotation of the fine-tuning knob then inserts or withdraws the slug from the field of oscillator coil 25 until optimum or bull's-eye tuning conditions have been established. Such conditions are observable from the picture and sound reproduction of the receiver and when they have been established, the fine-tuning control 74 is released permitting spring 81 to return tool 75 to its initial position.

The particular construction of the fine-tuning adjustment tool and bushing 83 insures that the tuning slug cannot be driven in the direction of the tuning strip beyond a point from which it can be readily retrieved. This becomes manifest on consideration of the result as the control 74 is rotated in a clockwise direction, driving finger 88 in the direction of its tuning strip until it ultimately reaches and travels along cam track 210 of one of bushing sectors 86. As finger 88 moves off the trailing end of that track and its rotation is continued, it strikes against the leading edge 211 of the next succeeding bushing sector 86 as a stop abutment. Since the finger 88 is formed of flexible material, it may occasionally be driven over and past this abutment but should that occur, the inward travel of the tuning slug resulting from its continued rotation assures that it will be arrested upon engaging the corresponding portion 211 of the next bushing sector 86. Once further movement of the slug has been restrained, continued rotation of tuning control 74 results in declutching of tool 75 and finger 88 because of the camming action of chamfered section 78 of the wrench. Displacement of the tuning slug in the opposite direction, that is toward housing end plate 62, is restricted by ear 91 struck from indexing plate 89. When the limit of travel has been reached, finger 88 engages ear 91 and precludes further counterclockwise rotation of the slug.

While the described arrangement imposes desired restrictions on the movement of tuning slug 87 in both directions, it has the further advantage of avoiding destruction of the driving portion of the tuning slug should rotation of tuning control 74 be continued after the slug has advanced to its limit in the direction of the tuning strip. This, of course, results from the camming action of chamfered section 78 which causes the tool to ride over finger 88 without mutilating the finger.

The structure has the further advantage that it is always conveniently possible to retract the tuning slug from the oscillator coil even after it has been advanced as far into the coil as the mechanism permits. The tool 75 has been described as cylindrical with an external diameter less than the internal diameter of bushing 83 and with an internal diameter which exceeds the external diameter of the tuning slug. It may, therefore, be inserted into the space between the bushing and slug and, by slight manipulation, can be brought into engagement with finger 88 as required to back the slug out of the coil.

It has been convenient to consider in detail the embodiment wherein the adjustable reactance of the tuning strip is a coil 25 with a tuning slug 87. Obviously, a capacitive reactance may be employed as well; it requires that a split conductive cylinder be utilized in place of coil 25 on strip 10. That cylinder serves as one electrode of a condenser and the tuning element 87, if formed of suitable conductive material, may constitute the other electrode of the condenser. Axial displacement of one electrode relative to the other varies the effective capacitive reactance.

The described arrangement makes possible bull's-eye tuning of a turret tuner with a minimum of parts and a minimum of expense. It avoids the need for a separate vernier condenser adjustment of the oscillator and permits fine tuning control from the front panel of the receiver by means of a convenient and simple arrangement for adjusting the tuning element incorporated on each tuning strip. In addition to its cost savings, this introduces stability to the heterodyning oscillator and avoids the tendencies of prior devices to vary oscillator excitation with adjustment of the fine tuning control. At the same time, the structure assures appropriate orientation of the terminal segments of the tuning strip required to assure their electrical engagement with stator contacts as any particular strip is brought into operating position by adjustment of the selector knob. Finally, positive restrictions are imposed on the displacement of the tuning knob by an arrangement which avoids damage to the tuning adjustment if the fine tuning control is overdriven.

While a particular embodiment of the invention has been shown and described, it will be obvious to those skilled in the art that changes and modifications may be made without departing from the invention in its broader aspects, and, therefore the aim in the appended claims is to cover all such changes and modifications as fall within the true spirit and scope of the invention.

I claim:

1. A turret-type tuning mechanism comprising: a tuning strip including a hollow core member and a plurality of conductive elements disposed in spaced relation therealong for contributing reactive impedances to determine the frequency characteristic of said strip; means including at least two spaced coaxially aligned support panels for demountably supporting said tuning strip; mounting means provided on one of said panels for receiving and mechanically supporting one end of said core member; and a tuning element comprised of a flexible material supported by said mounting means for introduction within said core member and yieldable obliquely of its axis to facilitate mounting and demounting said tuning strip between said support panels and displaceable axially of said mounting means and said core member to constitute with an adjacent end one of said conductive elements of said strip an adjustable reactance presenting an apparent reactance determined by the axial position of said element, the free end of said tuning element being formed to facilitate engagement by actuating means to effect selective axial displacement of said tuning element.

2. A turret-type tuning mechanism comprising: a tuning strip including a hollow core member and a plurality of conductive elements disposed in spaced relation therealong for contributing reactive impedances to determine the frequency characteristic of said strip; means including at least two spaced coaxially aligned support panels for demountably supporting said tuning strip; a bushing provided on one of said panels for receiving and mechanically supporting one end of said core member; a tuning element projecting through said bushing to extend within said core member and displaceable axially of said bushing and core member to constitute with the adjacent end one of said conductive elements of said strip an adjustable reactance presenting an apparent reactance determined by the axial position of said element, the free end of said tuning element including a driving member engageable by a tool to effect selective axial displacement of said element; and a shield container enclosing said turret mechanism having provisions to admit a tool into engagement with said free end of said tuning element, said bushing having a peripheral stop abutment for engaging said free end of said tuning element to limit displacement of said element in the direction of said core and having an internal diameter exceeding the transverse dimension of said tool to admit said tool for engagement with said element in operating intervals in which said element is arrested by said abutment.

3. A turret-type tuning mechanism comprising: a tuning strip including a hollow core member and a plurality of conductive elements disposed in spaced relation therealong for contributing reactive impedances to determine the frequency characteristic of said strip; a rotatable turret including at least two spaced coaxially aligned support panels for demountably supporting said tuning strip and for selectively moving said strip into an operating position; a selector knob mechanically coupled to said turret for effecting rotation thereof; a bushing provided on one of said panels for receiving and mechanically supporting one end of said core member; a tuning element projecting through said bushing to extend within said core member and displaceable axially of said bushing and core member to constitute with the adjacent end one of said conductive elements of said strip an adjustable reactance presenting an apparent reactance determined by the axial position of said element, the free end of said tuning element constituting a driving member; a tuning control concentrically disposed with respect to said selector knob comprising a tool in axial alignment with said tuning element and displaceable axially during intervals in which said strip is in said operating position for engaging said driving member to effect selective axial displacement of said tuning element; and a shield container enclosing said turret mechanism having provisions to admit said selector and said tuning control.

4. A turret-type tuning mechanism comprising: a tuning strip including a hollow core member and a plurality of conductive elements disposed in spaced relation therealong for contributing reactive impedances to determine the frequency characteristic of said strip; a rotatable turret including at least two spaced coaxially aligned support panels for demountably supporting said strip and for selectively moving said strip into an operating position; a selector knob mechanically coupled to said turret for effecting rotation thereof; a bushing provided on one of said panels for receiving and mechanically supporting one end of said support member; a tuning element projecting through said bushing to extend within said core member and displaceable axially of said bushing and core member to constitute with the adjacent end one of said conductive elements of said strip an adjustable reactance presenting an apparent reactance determined by the axial position of said element, the free end of said tuning element constituting a driving member; a tuning control concentrically disposed with respect to said selector knob comprising a tool in axial alignment with said tuning element and displaceable axially during intervals in which said strip is in said operating position for engaging said driving member to effect selective axial displacement of said tuning element; turret locking means comprising a plate secured to said turret and interposed in the path between said tuning element and said tool and having an apertured portion disposed across said path for receiving said tool to immobilize said turret when said tool is displaced to engage said tuning element; and a shield container enclosing said turret mechanism having provisions to admit said selector and said tuning control.

5. A turret-type tuning mechanism comprising: a tuning strip including a hollow core member and a plurality of conductive elements disposed in spaced relation therealong for contributing reactive impedances to determine the frequency characteristic of said strip; means including at least two spaced coaxially aligned support panels for demountably supporting said tuning strip; a bushing provided on one of said panels for receiving and mechanically supporting one end of said core member; a tuning element projecting through said bushing to extend within said core member and displaceable axially of said bushing and core member to constitute with the adjacent end one of said conductive elements of said strip an adjustable reactance presenting an apparent reactance determined by the axial position of said element, the free end of said tuning element including a driving member engageable by a tool to effect selective axial displacement of said element; and a shield container enclosing said turret mechanism having provisions to admit a tool into engagement with said free end of said tuning element, said bushing being slotted at one end to have a plurality of sectors and each such sector being canted in the direction of said core to constitute a cam track to be traversed by said driving member of said tuning element to limit displacement of said element in the direction of said core and said bushing having an internal diameter exceeding the transverse dimension of said tool to admit said tool for engagement with said element in operating intervals in which said element is arrested by said bushing.

6. A turret-type tuning mechanism comprising: a tuning strip including a hollow core member and a plurality of conductive elements disposed in spaced relation therealong for contributing reactive impedances to determine the frequency characteristic of said strip; means including at least two spaced coaxially aligned support panels for demountably supporting said tuning strip; a bushing provided on one of said panels for receiving and mechanically supporting one end of said core member; a cylindrically shaped tuning element threaded through said bushing and displaceable axially within said bushing and core member to constitute with the adjacent end one of said conductive elements of said strip an adjustable reactance presenting an apparent reactance determined by the axial position of said element, the free end of said tuning element including a transversely disposed driving member engageable by a tuning control; a shield container enclosing said turret mechanism having an aperture to admit a tuning control; and a tuning control supported by said shield container and displaceable through said aperture thereof to engage said tuning element, said control comprising a cylindrical shaft having an internal diameter exceeding the diameter of said tuning element and having a slotted end for receiving said driving member of said tuning element, and said bushing being slotted at one end to have a plurality of sectors each of which is canted in the direction of said core to constitute a cam track to be traversed by said driving member of said tuning element to limit displacement of said element in the direction of said core and said bushing further having an internal dameter exceeding the external diameter of said control to admit said control into engagement with said element in operating intervals in which said element is arrested by said bushing.

7. A turret-type tuning mechanism comprising: a tuning strip including a hollow core member and a plurality of conductive elements disposed in spaced relation therealong for contributing reactive impedances to determine the frequency characteristic of said strip; means including at least two spaced coaxially aligned support panels for demountably supporting said tuning strip; a bushing provided on one of said panels for receiving and mechanically supporting one end of said core member; a cylindrically shaped tuning element threaded through said bushing and displaceable axially within said bushing and core member to constitute with the adjacent end one of said conductive elements of said strip an adjustable reactance presenting an apparent reactance determined by the axial position of said element, the free end of said tuning element including a transversely disposed driving member engageable by a tuning control; and a tuning control supported by said tuning mechanism to engage said tuning element comprising a cylindrical shaft, having an internal diameter exceeding the diameter of said tuning element and having a slotted end for receiving said driving member of said tuning element, said bushing being slotted at one end to have a plurality of sectors each of which is canted in the direction of said core to constitute a cam track to be traversed by said driving member of said tuning element to limit displacement of said element in the direction of said core and said bushing further having an internal diameter exceeding the external diameter of said control to admit said control into engagement with said element in operating intervals in which said element is arrested by said bushing.

8. A turret-type tuning mechanism comprising: a tuning strip including a hollow core member and a plurality of conductive elements disposed in spaced relation therealong for contributing reactive impedances to determine the frequency characteristic of said strip; means including at least two spaced coaxially aligned support panels for demountably supporting said tuning strip; a threaded bushing provided on one of said panels for receiving and mechanically supporting one end of said core member; a tuning element displaceable axially within said bushing and core member to constitute with the adjacent end one of said conductive elements of said strip an adjustable reactance presenting an apparent reactance determined by the axial position of said element, said tuning element comprising a flexible coiled wire constituting a threaded element for threading through said bushing and one end of said wire projecting transversely beyond the coil turns of said element to constitute a driving member engageable by a tuning control; and a tuning control supported by said tuning mechanism to engage said tuning element comprising a cylindrical shaft, having an internal the axial position of said element, said tuning element and having a slotted end for receiving said driving member of said tuning element, said bushing being slotted at one end to have a plurality of sectors each of which is canted in the direction of said core to constitute a cam track to be traversed by said driving member of said tuning element to limit displacement of said element in the direction of said core and said bushng further having an internal diameter exceeding the external diameter of said control to admit said control into engagement with said element in operating intervals in which said element is arrested by said bushing.

9. A turret-type tuning mechanism comprising: a tuning strip including a hollow core member and a plurality of conductive elements disposed in spaced relation therealong for contributing reactive impedances to determine the frequency characteristic of said strip; means including at least two spaced coaxially aligned support panels for demountably supporting said tuning strip; a threaded bushing provided on one of said panels for receiving and mechanically supporting one end of said core member; a tuning element displaceable axially within said bushing and core member to constitute with the adjacent end one of said conductive elements of said strip an adjustable reactance presenting an apparent reactance determined by the axial position of said element, said tuning element comprising a flexible coiled wire constituting a threaded element for threading through said bushing and one end of said wire projecting transversely beyond the coil turns of said element to constitute a driving member engageable by a tuning control; and a tuning control supported by said tuning mechanism to engage said tuning element comprising a cylindrical shaft, having an internal diameter exceeding the diameter of said tuning element and having a slotted end for receiving said driving member of said tuning element, and one edge of the slotted portion of said control being shaped to form an inclined cam surface; said bushing being slotted at one end to have a plurality of sectors each of which is canted in the direction of said core to constitute a cam track to be traversed by said driving member of said tuning element to limit displacement of said element in the direction of said core and said bushing further having an internal diameter exceeding the external diameter of said control to admit said control into engagement with said element in operating intervals in which said element is arrested by said bushing.

10. A turret-type tuning mechanism comprising: a plurality of tuning strips individually supporting impedance elements disposed in spaced relation therealong for contributing reactive impedances to determine the frequency characteristic of said strip, the impedance element at one end of each strip comprising a multi-turn coil; a rotatable turret including at least two spaced coaxially aligned support panels for rotatably supporting said tuning strips for selective movement into an operating position; a selector knob mechanically coupled to said turret for effecting rotation thereof; a tuning element for each of said strips having one end projecting from within said coil through the one of said support panels adjacent said coil, having a threaded portion mounted for rotation to adjust the penetration of the tuning element into said coil and having at said end a driving portion to be engaged by a tuning control tool; a tuning control tool supported in alignment with the tuning element of the one of said strips that is instantaneously in said operating position, said tool being normally retained out of engagement with said tuning element but displaceable into driving engagement therewith; a fine tuning control knob supported concentrically with said selector knob for rotation relative thereto, said fine tuning knob being mechanically coupled to said tool to effect axial displacement thereof into engagement with said tuning element; and a stop abutment for limiting the axial displacement of said tuning element within said coil.

References Cited in the file of this patent

UNITED STATES PATENTS

| | | |
|---|---|---|
| 2,545,681 | Zepp et al. | Mar. 20, 1951 |
| 2,648,031 | Lang et al. | Aug. 4, 1953 |
| 2,657,365 | Lazzery | Oct. 27, 1953 |
| 2,756,599 | Sperber | July 31, 1956 |
| 2,799,170 | Davis | July 16, 1957 |
| 2,868,982 | Carlson | Jan. 13, 1959 |

FOREIGN PATENTS

| | | |
|---|---|---|
| 684,041 | Great Britain | Dec. 10, 1952 |
| 922,177 | Germany | Jan. 10, 1955 |
| T7,279 | Germany | Apr. 12, 1956 |